Aug. 2, 1966 B. J. FALANGA ETAL 3,263,304

METHOD FOR MOUNTING ELECTRICAL CIRCUITRY

Filed Jan. 3, 1963 2 Sheets-Sheet 1

INVENTORS
B. J. FALANGA
A. GINGRANDE
G. J. MAROTTA
A. J. MURABITO
J. F. RUSSELL JR.
R. A. WADDELL

BY H. R. Bergum
ATTORNEY

Aug. 2, 1966 B. J. FALANGA ET AL 3,263,304

METHOD FOR MOUNTING ELECTRICAL CIRCUITRY

Filed Jan. 3, 1963 2 Sheets-Sheet 2

INVENTORS
B.J.FALANGA
A.GINGRANDE
G.J.MAROTTA
A.J.MURABITO
J.F.RUSSELL JR.
R.A.WADDELL

BY [signature]

ATTORNEY 3,263,304
METHOD FOR MOUNTING ELECTRICAL CIRCUITRY

Bruno J. Falanga, Lawrence, Arthur Gingrande, Boxford, George J. Marotta, Andover, Anthony J. Murabito, Methuen, James F. Russell, Jr., Topsfield, and Robert A. Waddell, Winthrop, Mass., assignors to Western Electric Company, Incorporated, New York, N.Y., a corporation of New York Filed Jan. 3, 1963, Ser. No. 249,179
7 Claims. (Cl. 29—155.5)

This invention relates to a method of applying an electrical circuit to an insulating base and particularly to a method of applying a carrier sheet including a printed circuit to an insulating base.

The term printed wiring as used herein refers to a conductive pattern, however made, attached to the insulating base, and used to interconnect electrical components. A printed circuit as used herein refers to the combination of printed wiring with electrical components associated therewith.

During the past several years, there has been an increasing demand for printed circuit boards. This has resulted primarily because such boards are conducive both to large scale, economical manufacture, and to miniaturization.

There are many methods for producing a conductive pattern on an insulating base which are known in the art. Among such known methods are: chemical removal of unwanted metal from a metal clad base, or printing, painting, or plating the desired conductive pattern on an insulating base. Another method includes electrically depositing metal on a cathode plate so that it is held by a low peel strength, and then transferring the metal to the desired base having a higher peel strength. In still another method the pattern is produced mechanically and then made to adhere to the surface of the base material, such as by bonding.

Prior to this invention, holes had to be punched or drilled in the circuit board base before components could be mounted thereon. The conductive leads of the components were then inserted in the holes and individually connected to the printed pattern.

Many difficulties are encountered in fabricating printed circuits on insulating bases in this manner. First, it is a tedious job to insert each component lead into the proper aperture since the component must be supported firmly while making a connection of the leads to the printed wiring. Secondly, the soldered connections between the printed wiring and the lead ends often serve as a major support for the component which tends to weaken the electrical connection and increase the possibility of electrical failure.

Accordingly, a primary object of this invention is a new and improved method of fabricating printed wiring circuits on an insulating base.

Generally, this invention relates to a method which includes forming a conductive wiring pattern on a carrier sheet, placing the pattern and carrier sheet on the bottom surface of a primary mold, preferably with the wiring pattern against the surface of the primary mold, and casting a secondary mold in the primary mold. The secondary mold is of a material which allows its removal as a one-piece, flexible unit, with the carrier sheet and wiring pattern embedded therein and forming the bottom surface of the cavity in the secondary mold, the wiring pattern preferably being exposed above the carrier sheet.

In accordance with an aspect of the invention, the leads of the electrical components are pierced through the wiring pattern, carrier sheet and into the secondary mold material, thereby supporting the components in a predetermined fixed relationship within the mold cavity.

Plastic insulating material, nonadherent to the mold material, but adherent to the wiring pattern, is then poured into the mold cavity about the component leads and over the wiring pattern and carrier sheet so as to fill all spaces created by the configuration of the wiring pattern. The cast material hardens into a rigid insulating base.

The secondary mold is thereafter stripped from the hardened base with the printed circuit embedded therein and the carrier sheet attached thereto. The componnts are thus disposed on one side of the panel with their electrical terminal ends protruding through the wiring pattern on the other side. As the component leads and wiring pattern are embedded in the base, they are firmly supported. The carrier sheet is then removed and the leads mass connected to the wiring pattern, such as by dipping the terminal end side of the board into a solder bath.

The aspects of piercing electrical terminals into the base of a secondary mold, casting an insulating base about the terminals, and stripping the secondary mold from the insulating base in the absence of printed wiring and the use of mass soldering associated therewith, was previously disclosed in a copending application of Gingrande-Marotta, Serial No. 95,990, filed March 15, 1961, now patent 3,120,573 and assigned to the same assignee.

In a preferred method according to the invention, the wiring pattern is etched from adhesive resisted copper placed on a carrier sheet of material such as vinyl or urethane. Suitable adhesive resists include phenolic, epoxy or furfural. The flexible secondary mold is cast from compounded cellulose acetate butyrate, referred to hereinafter as C.A.B., and the panel material is cold casting epoxy resin.

A complete understanding of the invention may be obtained from the following detailed description, when read in conjunction with the accompanying drawings, in which.

Figures 1, 2, 3:
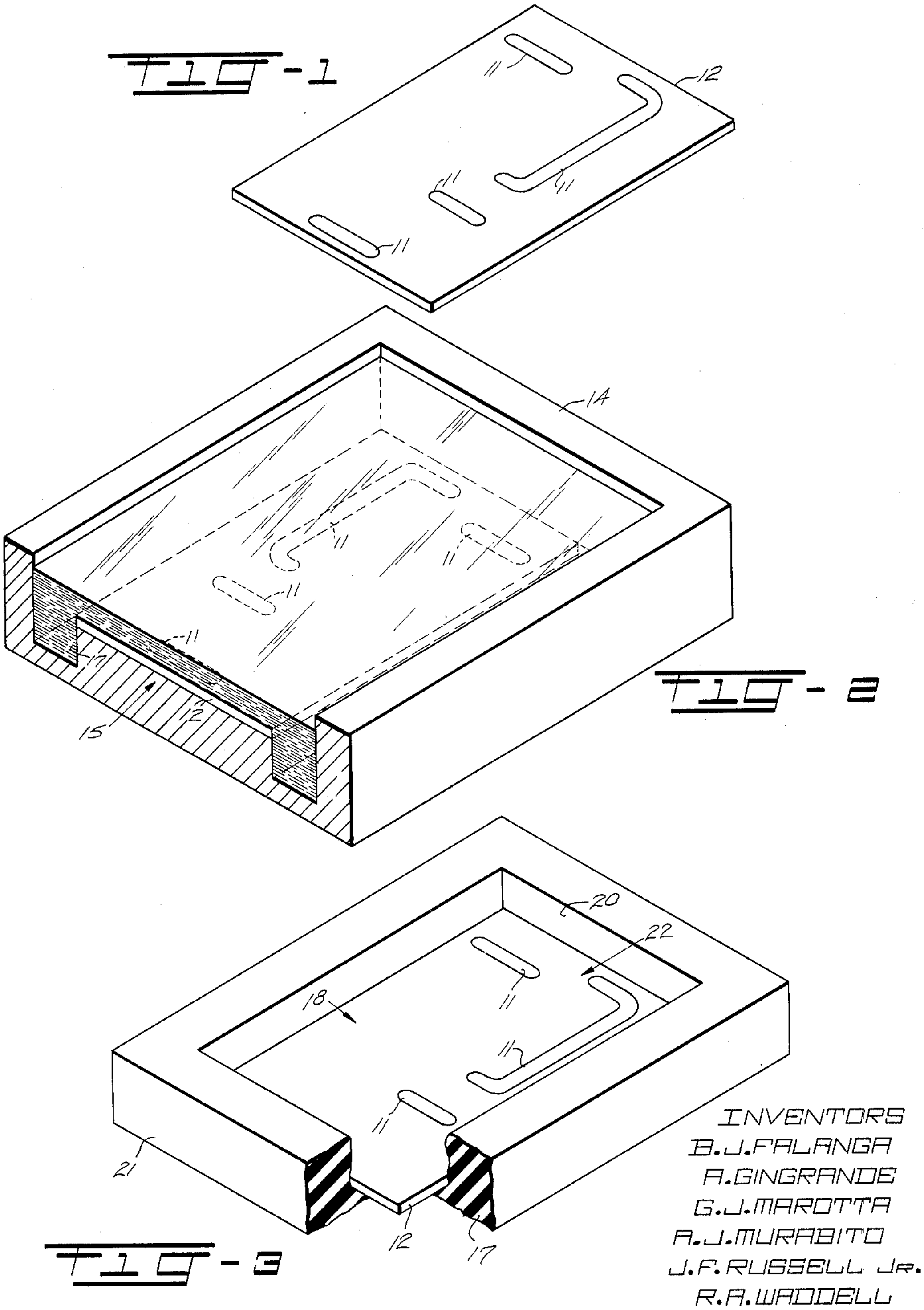
FIG. 1 is an isometric view of an electrical wiring pattern on a carrier sheet.
FIG. 2 is an isometric view, partly in section, of a secondary mold being cast in a primary mold with an electrical wiring pattern on a carrier sheet positioned within the primary mold.
FIG. 3 is an isometric view of the secondary mold with the printed wiring and carrier sheet cast into the base of the mold cavity.

Referring now to the drawings, a conductive wiring pattern 11 is formed upon a carrier sheet 12. Methods of forming the conductive wiring pattern 11 are well-known in the art. A preferred method is to apply an adhesive-resist, such as phenolic, epoxy or furfural to the treated side of electrical grade copper foil so that the resist covers the circuit paths. After the adhesive resist is cured by techniques such as air drying, baking or flash curing, the copper foil is placed on a carrier sheet made of a material such as vinyl or urethane and the unwanted copper is removed by use of etching solutions, such as ferric chloride or ammonium per-sulfate. However, it is to be understood that any method of forming a conductive pattern, such as dinking or the use of a conductive pattern with a low peel strength is applicable to the method invention. Another technique which is particularly well suited to the method invention is to electroplate the wiring pattern onto those unmasked areas of a sheet of solder foil which have not been coated with resist.

The carrier sheet 12 with the conductive pattern 11 affixed thereto is placed within the primary mold 14, best seen in FIG. 2, so as to lie on the base 15 with the wiring side facing downward. A thermoplastic material 17, such as compounded cellulose acetate butyrate (C.A.B.) is cast in the primary mold 14 to form a secondary mold 21. The primary mold 14 may have any desired configuration and is preferably made from a metal such as aluminum. When the mold material 17 has set, the secondary mold 21, a one-piece flexible cast mold is easily removed from the primary mold 14.

As best seen in FIG. 3, the secondary mold 21, upon being positioned bottom side up, has a molding cavity 22 which is formed by the elevated wall portions 20 and the recessed face portion 18. The carrier sheet 12 forms the surface of the recessed face portion 18, with the printed wiring pattern 11 preferably exposed. Otherwise, the carrier sheet 12 would have to be fused into the insulating mounting base which is to be subsequently cast in the secondary mold 21. However, if the carrier sheet 12 is suitable for this purpose, the printed wiring pattern 11 can be located beneath carrier sheet 12 in the cavity 22 of the secondary mold 21.

Figure 4:
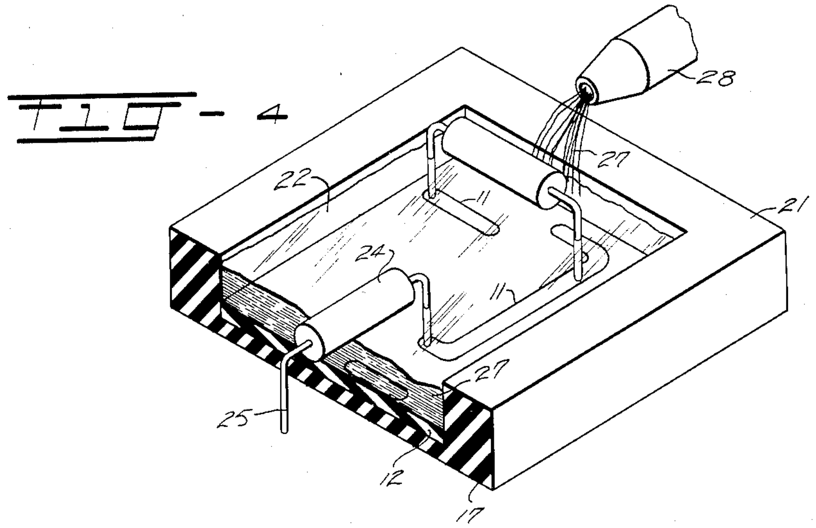
FIG. 4 is an isometric view, partly in section, showing the secondary mold with component leads inserted into the mold through the wiring pattern in preparation for casting insulating plastic material into the mold cavity.
Figure 6:
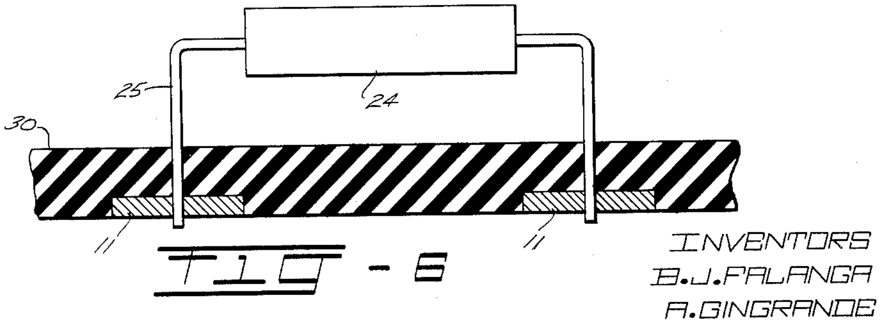
FIG. 6 is a cross-sectional view, showing an electrical component and a portion of the mounting panel with the printed wiring embedded therein in accordance with the present invention.

The secondary mold 21 is placed on a work table or other convenient support for placing the electrical components 24 within the secondary mold cavity 22. The component leads 25, as depicted in FIGS. 4 and 6, are then pierced through the conductive wiring pattern 11 and carrier sheet 12 into the mold material 17 forming the secondary mold 21.

Figure 5:
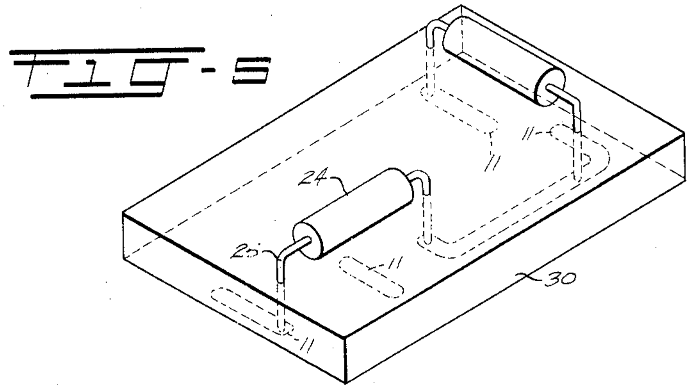
FIG. 5 is an isometric view of a hardened base from which the mold has been stripped, showing the wiring pattern in phantom.

Thereafter, insulating plastic base material 27 is poured, such as from a suitable container 28, into the secondary mold cavity 22 in direct contact with the printed wiring pattern 11, exposed areas of the carrier sheet 12, and about the component leads 25. The depth of the poured material 27, which forms the base 30 of the circuit board as depicted in FIGS. 5 and 6, depends upon the rigidity of the base required for a given circuit application. Advantageously, the components 24 are firmly supported during the casting of the plastic panel material 27 by the thermoplastic material 17 and the carrier sheet 12.

The plastic base material 27 is then allowed to harden to the desired consistency, either at room temperature or above by air drying, or at a higher temperature by flash curing, or baking, provided the heat applied does not exceed the melting temperature of the material 17 used in the secondary mold 21. Since the material 17 is nonadherent to either the plastic base material 27 or the carrier sheet 12, the secondary mold 21 is easily stripped from the hardened base 30 with the printed circuitry embedded therein and the carrier sheet 12 attached thereto. The carrier sheet can thereafter be pulled, burned, dissolved, or melted from the hardened base 30 depending on the composition of the carrier sheet.

The electrical components 24 are firmly supported on the insulating plastic base by substantial portions of the component leads 25 being embedded therein and bonded thereto. Electrical connections can be made between the leads 25 and the printed conductive pattern 11 by dipping the base 30 in a molten solder bath, for example. If solder foil is used as a carrier, the dipping of the assembly into molten solder will melt away the unwanted portions of the circuit and bond the component leads to the circuit path in one operation.

It is to be understood that the above described arrangements and methods of manufacture are merely illustrative of the general principles of the present invention. Numerous other arrangements, methods and modifications may be readily devised by those skilled in the art which will embody the principles of the invention and fall within the spirit and scope thereof.

What is claimed is:

1. A method of fabricating printed wiring circuits including an insulating base, a wiring circuit mounted thereon and components associated therewith comprising:
   - forming a conductive wiring pattern on a carrier sheet,
   - placing the carrier sheet with the conductive wiring pattern attached on a recessed base of a cavity of a primary mold such that the wiring pattern surface contacts said recessed base,
   - casting a secondary mold of plastic material within the primary mold so that the conductive wiring pattern is exposed on the bottom surface of the base of a cavity in the secondary mold when it is reversed bottom side up,
   - removing the secondary mold from the primary mold,
   - piercing the terminals of components through the conductive wiring pattern and carrier sheet into the plastic material of the secondary mold,
   - pouring an insulating plastic casting material into the cavity of the secondary mold in direct contact with the exposed areas of the carrier sheet and the conductive wiring pattern to a desired depth about the exposed terminal leads,
   - hardening the plastic casting material to form a supporting base,
   - stripping the secondary mold from the supporting base with the terminals and conductive wiring pattern remaining embedded in the supporting base and the carrier sheet attached thereto,
   - removing the carrier sheet from the supporting base, and
   - connecting the terminal ends to the conductive wiring pattern.

2. A method according to claim 1 wherein:
   the carrier sheet is removed from the base by burning.

3. A method according to claim 1 wherein:
   the terminal ends are connected to the conductive wiring pattern by dipping the pattern in molten solder.

4. A method of fabricating printed wiring circuits including an insulating base, a wiring circuit mounted thereon and components associated therewith comprising:
   - forming a conductive wiring pattern on a vinyl sheet,
   - placing the vinyl sheet with the conductive wiring pattern attached on the base of a cavity of a primary mold such that the wiring pattern surface contacts said base,
   - casting a secondary mold of compounded cellulose acetate butyrate within the primary mold so that the conductive wiring pattern is exposed on the bottom surface of the base of a cavity in the secondary mold when it is reversed bottom side up,
   - removing the secondary mold from the primary mold,
   - piercing the terminals of components through the conductive wiring pattern and vinyl sheet into the compounded cellulose acetate butyrate of the secondary mold,
   - pouring epoxy resin into the cavity of the secondary mold in direct contact with the exposed areas of the vinyl sheet and the conductive wiring pattern to a desired depth about the exposed terminal leads,
   - curing the epoxy resin to form a supporting base,
   - stripping the secondary mold from the supporting base with the terminals and conductive wiring pattern remaining embedded therein, and the vinyl sheet attached thereto,
   - removing the vinyl sheet from the supporting base, and
   - connecting the terminal ends to the conductive wiring pattern.

5. A method of fabricating printed wiring circuits including an insulating base, a wiring circuit mounted thereon and components associated therewith comprising:
forming a conductive wiring pattern on a urethane sheet,
placing the urethane sheet with the conductive wiring pattern attached on the base of a cavity of a primary mold such that the plated solder foil surface contacts said base,
casting a secondary mold of compounded cellulose acetate butyrate within the primary mold so that the conductive wiring pattern is exposed on the bottom surface of the base of a cavity in the secondary mold when it is reversed bottom side up,
removing the secondary mold from the primary mold,
piercing the terminals of components through the conductive wiring pattern and urethane sheet into the compounded cellulose acetate butyrate of the secondary mold,
pouring epoxy resin into the cavity of the secondary mold in direct contact with the exposed areas of the urethane sheet and the conductive wiring pattern to a desired depth about the exposed terminal leads,
curing the epoxy resin to form a supporting base,
stripping the secondary mold from the supporting base with the terminals and conductive wiring pattern remaining embedded therein and the urethane sheet attached thereto,
removing the urethane sheet from the supporting base, and
connecting the terminal ends to the conductive wiring pattern.

6. A method of fabricating wiring circuits which comprises:
resisting a sheet of solder foil to define a predetermined pattern,
plating metal on the exposed pattern areas of the solder foil,
placing the plated solder foil on the base of a cavity of a primary mold such that the surface of the metal pattern contacts said base,
casting within the primary mold a one-piece, flexible secondary mold of compounded cellulose acetate butyrate so that the metal pattern is exposed in a cavity of the secondary mold when it is reversed bottom side up,
removing the secondary mold from the primary mold,
piercing the leads of components through the metal pattern and foil into the compounded cellulose acetate butyrate,
pouring epoxy resin into the cavity of the secondary mold in direct contact with the metal pattern and exposed areas of the solder foil to a desired depth about the exposed component leads,
curing the epoxy resin to form a hardened supporting base,
stripping the secondary mold from the hardened base with the leads, metal plated pattern and solder foil embedded therein, and
dipping the exposed solder foil into a molten solder bath to remove the exposed solder foil and to solder the terminal ends to the metal wiring pattern.

7. A method of fabricating wiring circuits which comprises:
forming a conductive wiring pattern on a carrier sheet,
placing the carrier sheet with the conductive wiring pattern attached on the base of a cavity of a primary mold,
casting a secondary mold of plastic material within the primary mold,
removing the secondary mold from the primary mold with the carrier sheet and conductive wiring pattern cast therein,
piercing the terminals of components through the carrier sheet conductive wiring pattern and into the plastic material of the secondary mold,
pouring an insulating plastic casting material into a cavity of the secondary mold in direct contact with the carrier sheet and about the exposed treminal leads,
hardening the plastic casting material to form a supporting base,
stripping the secondary mold from the supporting base, and
making an electrical connection between each terminal end and the conductive wiring pattern.

References Cited by the Examiner

UNITED STATES PATENTS

| | | | |
|---|---|---|---|
| 3,070,844 | 1/1963 | Warnken | 18—36 |
| 3,072,967 | 1/1963 | Mathews et al. | 18—36 |
| 3,085,295 | 4/1963 | Pizzino et al. | 264—272 XR |
| 3,115,386 | 12/1963 | Zentmyer | 264—261 |
| 3,120,572 | 2/1964 | Shannon | 264—261 |
| 3,120,573 | 2/1964 | Gingrande et al. | 264—278 XR |
| 3,121,771 | 2/1964 | Stearns | 174—68.5 |
| 3,129,280 | 4/1964 | Elarde | 174—68.5 |
| 3,185,952 | 5/1965 | Potter et al. | 29—155.5 XR |

ROBERT F. WHITE, *Primary Examiner.*

ALEXANDER H. BRODMERKEL, *Examiner.*

F. MARLOWE, T. J. CARVIS, *Assistant Examiners.*